(12) United States Patent
Li

(10) Patent No.: US 9,941,312 B2
(45) Date of Patent: Apr. 10, 2018

(54) MANUFACTURING METHOD FOR LTPS TFT SUBSTRATE

(71) Applicant: Shenzhen China Star Optoelectronics Technology Co., Ltd., Shenzhen (CN)

(72) Inventor: Songshan Li, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 245 days.

(21) Appl. No.: 14/908,555

(22) PCT Filed: Dec. 30, 2015

(86) PCT No.: PCT/CN2015/099985
§ 371 (c)(1),
(2) Date: Jan. 29, 2016

(87) PCT Pub. No.: WO2017/092142
PCT Pub. Date: Jun. 8, 2017

(65) Prior Publication Data
US 2018/0033808 A1 Feb. 1, 2018

(30) Foreign Application Priority Data

Dec. 3, 2015 (CN) .......................... 2015 1 0885433

(51) Int. Cl.
*H01L 27/12* (2006.01)
*H01L 29/06* (2006.01)
(Continued)

(52) U.S. Cl.
CPC .... *H01L 27/1274* (2013.01); *H01L 21/02532* (2013.01); *H01L 21/02592* (2013.01);
(Continued)

(58) Field of Classification Search
None
See application file for complete search history.

(56) References Cited

U.S. PATENT DOCUMENTS 5,581,102 A * 12/1996 Kusumoto ........ H01L 29/66757
257/347
9,601,518 B2 * 3/2017 Moon ................. H01L 27/1225
(Continued)

*Primary Examiner* — Joseph Schoenholtz
(74) *Attorney, Agent, or Firm* — Leong C. Lei

(57) ABSTRACT

The invention provides a manufacturing method for LTPS TFT substrate. After forming N+ areas on both sides of polysilicon layer, the first gate insulating layer, first gate, second gate insulating layer, and second gate are sequentially formed on polysilicon layer, and the second gate is wider than first gate to produce a low electric field region in the polysilicon layer to reduce leakage current; alternatively, forming first gate and first gate insulating layer, forming polysilicon layer and N+ areas on both sides of polysilicon layer, forming second gate insulating layer and second gate on polysilicon layer, the second gate insulating layer is thicker than first gate insulating layer and the second gate is wider than first gate, so that the second gate insulating layer sandwiched by the second gate beyond first gate and polysilicon layer is thicker and produces a smaller electric field, which simplifies process and reduce cost.

11 Claims, 5 Drawing Sheets

(51) Int. Cl.
    *H01L 29/786*   (2006.01)
    *H01L 29/66*    (2006.01)
    *H01L 29/45*    (2006.01)
    *H01L 21/266*   (2006.01)
    *H01L 29/423*   (2006.01)
    *H01L 21/02*    (2006.01)
    *H01L 21/265*   (2006.01)
    *H01L 21/30*    (2006.01)
    *H01L 29/49*    (2006.01)

(52) U.S. Cl.
    CPC ...... *H01L 21/02675* (2013.01); *H01L 21/266* (2013.01); *H01L 21/26513* (2013.01); *H01L 21/3003* (2013.01); *H01L 27/1222* (2013.01); *H01L 27/1288* (2013.01); *H01L 29/0607* (2013.01); *H01L 29/42384* (2013.01); *H01L 29/458* (2013.01); *H01L 29/4908* (2013.01); *H01L 29/66757* (2013.01); *H01L 29/66765* (2013.01); *H01L 29/78618* (2013.01); *H01L 29/78645* (2013.01); *H01L 29/78648* (2013.01); *H01L 29/78675* (2013.01); *H01L 29/78678* (2013.01)

(56) References Cited

U.S. PATENT DOCUMENTS

| 2004/0135180 | A1* | 7/2004 | Makita | H01L 21/2022 257/285 |
| 2012/0007158 | A1* | 1/2012 | Yoon | H01L 21/28291 257/295 |
| 2015/0069383 | A1* | 3/2015 | Suzuki | H01L 29/78606 257/43 |

* cited by examiner

MANUFACTURING METHOD FOR LTPS TFT SUBSTRATE

BACKGROUND OF THE INVENTION

1. Field of the Invention

The present invention relates to the field of display, and in particular to a manufacturing method for low temperature polysilicon (LTPS) thin film transistor (TFT) substrate.

2. The Related Arts

The liquid crystal display (LCD) provides the advantages of thin, low power consumption, radiation-free, and so on, and is widely applied to, such as, mobile phones, personal digital assistant (PDA), digital camera, computer monitors and notebook computers.

The conventional liquid crystal display devices on the market are mostly of the backlight type, comprising a case, a liquid crystal panel and a backlight module disposed inside the case. The traditional structure of the liquid crystal panel comprises a color filter (CF) substrate, a TFT array substrate, and a liquid crystal layer sandwiched between two substrates. The working principle is to apply a driving voltage to the two glass substrates to control the rotation of the liquid crystal molecules of the liquid crystal layer to refract the light from backlight to display.

LTPS technology is a new generation TFT substrate manufacturing technology, and the major difference between the conventional amorphous silicon (a-Si) technology and LTPS technology is that the LTPS provides that advantages of high response speed, high brightness, high-resolution and low power consumption.

Refer to FIG. 1 for a schematic cross-sectional structure of the known LTPS TFT substrate, which is manufactured by a method comprising the following steps: depositing serially a buffer layer 200, and an a-Si layer on the substrate 100. The a-Si layer is crystallized by an excimer laser annealing (ELA) process into a polysilicon (Poly-Si), then by a lithography process to obtain a polysilicon layer 300. Then, twice the mask is respectively used to perform ion implantation on the polysilicon layer 300 to obtain an N-type heavily doped (N+) area and an N-type lightly doped (N−) area to obtain a lightly doped drain region (LDD). Then, through multiple deposition, lithography and etching processes to obtain a gate insulating layer 400, a gate 500, an interlayer insulating layer 600, and the source/drain 700. The final structure of the LTPS TFT substrate is shown in FIG. 1.

The aforementioned manufacturing method for conventional LTPS TFT substrate shows some drawbacks, i.e., two ion implantation processes must be used after defining N+ and N− areas of LTPS TFT substrate, which is complex and high cost. Therefore, it is desirable to provide a manufacturing method for LTPS TFT substrate to solve the above problems.

SUMMARY OF THE INVENTION

The object of the present invention is to provide a manufacturing method for LTPS TFT substrate, to decrease the ion implantation process by one to simplify the process and reduce cost.

To achieve the above object, the present invention provides a manufacturing method for LTPS TFT substrate, which comprises: Step 1: providing a substrate, and depositing a buffer layer on the substrate; Step 2: depositing an a-Si layer on the buffer layer, performing dehydrogenation treatment on the a-Si layer, performing a crystallization process to turn the a-Si layer into a polysilicon layer, and patterning the polysilicon layer to obtain the island-shape polysilicon layer; Step 3: coating a photo-resist on the island-shape polysilicon layer and performing exposure and development on the photo-resist to form a photo-resist layer; using the photo-resist layer as a masking layer to perform ion implantation on both sides of the island-shape polysilicon layer to form an N-type heavily doped (N+) area on both sides of the island-shape polysilicon layer and an undoped area between the two N+ areas, and then peeling the photo-resist layer off; Step 4: depositing a first gate insulating layer on the island-shape polysilicon gate layer, depositing a first metal layer on the first gate insulating layer, and patterning the first metal layer to obtain a corresponding first gate above the undoped area, and the first gate having a width smaller than the width of the undoped area; Step 5: depositing a second gate insulating layer on the first gate insulating layer and the first gate, depositing a second metal layer on the second gate insulating layer, patterning the second metal layer to obtain a corresponding second gate above the first gate, the second gate having a width equal to the width of the undoped area, and both ends of the second gate exceeding beyond both ends of the first gate so that the portion of the undoped area covered by both the first gate and the second gate forming a groove area with strong electric field, and the portion of the undoped area covered only by the second gate forming a low electric field area; Step 6: depositing an interlayer insulating layer between the second gate insulting layer and the second gate; performing a lithography process to form vias on the interlayer insulating layer, the first gate insulating layer, and the second gate insulating layer over the N+ areas on both sides of the island-shape polysilicon layer; and Step 7: depositing a third metal layer on the interlayer insulating layer, patterning the third metal layer to obtain source/drain, the source/drain contacting through the vias the N+ areas on both sides of the island-shape polysilicon layer.

In Step 1, the substrate is a glass substrate; the buffer layer is a composite layer with a silicon nitride layer and a silicon oxide layer; the thickness of the silicon nitride layer is 40-100 nm; the thickness of the silicon oxide layer is 100-200 nm.

In Step 2, the thickness of the a-Si layer is 40-60 nm; the crystallization process is an excimer laser annealing or solid-phase crystallization process.

The first gate insulating layer and the second gate insulating layer are made of silicon nitride or silicon oxide; the first gate and the second gate are made of molybdenum; the interlayer insulating layer is a silicon nitride layer, a silicon oxide layer, or a combination of the two; the source/drain is a molybdenum/aluminum/molybdenum composite layer.

The ends of the second gate exceed beyond both ends of the first gate by 1-2 μm, respectively.

The present invention also provides a manufacturing method for LTPS TFT substrate, which comprises: Step 1: providing a substrate, and depositing a buffer layer on the substrate; Step 2: depositing a first metal layer on the buffer layer, patterning the first metal layer to obtain a first gate, and depositing a first gate insulating layer on the first gate; Step 3: depositing an a-Si layer on the first gate insulating layer, performing dehydrogenation treatment on the a-Si layer, performing a crystallization process to turn the a-Si layer into a polysilicon layer, and patterning the polysilicon layer to obtain the island-shape polysilicon layer above the corresponding first gate; Step 4: coating a photo-resist on the island-shape polysilicon layer and performing exposure and development on the photo-resist to form a photo-resist layer; using the photo-resist layer as a masking layer to perform ion implantation on both sides of the island-shape polysilicon layer to form an N-type heavily doped (N+) area on both sides of the island-shape polysilicon layer and an undoped area between the two N+ areas, and then peeling the photo-resist layer off, wherein the undoped area having a width greater than the width of the first gate; Step 5: depositing a second gate insulating layer on the island-shape polysilicon gate layer, depositing a second metal layer on the second gate insulating layer, and patterning the second metal layer to obtain a corresponding second gate above the undoped area, and the second gate insulating layer having a thickness greater than the thickness of the first gate insulating layer, wherein the second gate having a width equal to the width of the undoped area, and both ends of the second gate exceeding beyond both ends of the first gate so that the portion of the undoped area covered by both the first gate and the second gate forming a groove area with strong electric field, and the portion of the undoped area covered only by the second gate forming a low electric field area; Step 6: depositing an interlayer insulating layer between the second gate insulting layer and the second gate; performing a lithography process to form vias on the interlayer insulating layer and the second gate insulating layer over the N+ areas on both sides of the island-shape polysilicon layer; and Step 7: depositing a third metal layer on the interlayer insulating layer, patterning the third metal layer to obtain source/drain, the source/drain contacting through the vias the N+ areas on both sides of the island-shape polysilicon layer.

In Step 1, the substrate is a glass substrate; the buffer layer is a composite layer with a silicon nitride layer and a silicon oxide layer; the thickness of the silicon nitride layer is 40-100 nm; the thickness of the silicon oxide layer is 100-200 nm.

In Step 2, the thickness of the a-Si layer is 40-60 nm; the crystallization process is an excimer laser annealing or solid-phase crystallization process.

The first gate insulating layer and the second gate insulating layer are made of silicon nitride or silicon oxide; the first gate and the second gate are made of molybdenum; the interlayer insulating layer is a silicon nitride layer, a silicon oxide layer, or a combination of the two; the source/drain is a molybdenum/aluminum/molybdenum composite layer.

The thickness of the second gate insulating layer is greater than the thickness of the first gate insulating layer by 200-500 Å; the ends of the second gate exceed beyond both ends of the first gate by 1-2 μm, respectively.

The present invention also provides a manufacturing method for LTPS TFT substrate, which comprises: Step 1: providing a substrate, and depositing a buffer layer on the substrate; Step 2: depositing a first metal layer on the buffer layer, patterning the first metal layer to obtain a first gate, and depositing a first gate insulating layer on the first gate; Step 3: depositing an a-Si layer on the first gate insulating layer, performing dehydrogenation treatment on the a-Si layer, performing a crystallization process to turn the a-Si layer into a polysilicon layer, and patterning the polysilicon layer to obtain the island-shape polysilicon layer above the corresponding first gate; Step 4: coating a photo-resist on the island-shape polysilicon layer and performing exposure and development on the photo-resist to form a photo-resist layer; using the photo-resist layer as a masking layer to perform ion implantation on both sides of the island-shape polysilicon layer to form an N-type heavily doped (N+) area on both sides of the island-shape polysilicon layer and an undoped area between the two N+ areas, and then peeling the photo-resist layer off, wherein the undoped area having a width greater than the width of the first gate; Step 5: depositing a second gate insulating layer on the island-shape polysilicon gate layer, depositing a second metal layer on the second gate insulating layer, and patterning the second metal layer to obtain a corresponding second gate above the undoped area, and the second gate insulating layer having a thickness greater than the thickness of the first gate insulating layer, wherein the second gate having a width equal to the width of the undoped area, and both ends of the second gate exceeding beyond both ends of the first gate so that the portion of the undoped area covered by both the first gate and the second gate forming a groove area with strong electric field, and the portion of the undoped area covered only by the second gate forming a low electric field area; Step 6: depositing an interlayer insulating layer between the second gate insulting layer and the second gate; performing a lithography process to form vias on the interlayer insulating layer and the second gate insulating layer over the N+ areas on both sides of the island-shape polysilicon layer; and Step 7: depositing a third metal layer on the interlayer insulating layer, patterning the third metal layer to obtain source/drain, the source/drain contacting through the vias the N+ areas on both sides of the island-shape polysilicon layer; wherein in Step 1, the substrate is a glass substrate; the buffer layer is a composite layer with a silicon nitride layer and a silicon oxide layer; the thickness of the silicon nitride layer is 40-100 nm; the thickness of the silicon oxide layer is 100-200 nm; wherein in Step 2, the thickness of the a-Si layer is 40-60 nm; the crystallization process is an excimer laser annealing or solid-phase crystallization process; wherein the first gate insulating layer and the second gate insulating layer are made of silicon nitride or silicon oxide; the first gate and the second gate are made of molybdenum; the interlayer insulating layer is a silicon nitride layer, a silicon oxide layer, or a combination of the two; the source/drain is a molybdenum/aluminum/molybdenum composite layer; wherein the thickness of the second gate insulating layer is greater than the thickness of the first gate insulating layer by 200-500 Å; the ends of the second gate exceed beyond both ends of the first gate by 1-2 μm, respectively.

Compared to the known techniques, the present invention provides the following advantages: the present invention provides a manufacturing method for LTPS TFT substrate. After forming N+ areas on both sides of the polysilicon layer, the first gate insulating layer, the first gate, the second gate insulating layer, and the second gate are sequentially formed on the polysilicon layer, and the second gate having a width greater than the width of the first gate to produce a low electric field region in the polysilicon layer to reduce the leakage current; alternatively, forming the first gate and the first gate insulating layer on the buffer layer, and after forming the polysilicon layer and N+ areas on both sides of the polysilicon layer, the second gate insulating layer and the second gate are formed on the polysilicon layer, and the second gate insulating layer is thicker than the first gate insulating layer and the second gate is wider than the first gate, so that the second gate insulating layer sandwiched by the portion of the second gate beyond the first gate and polysilicon layer is thicker and produces a smaller electric field, less electrons are induced in the polysilicon layer, and thus to reduce the leakage current. Compared with the prior art, the present invention, after forming N+ areas on both sides of the polysilicon layer, does not need to use a mask to define N− areas and implant low dosage of phosphorus ions to form N– areas to reduce leakage current, but to use the difference between the first gate and the second gate to produce a low electric field to reduce the leakage current, which simplifies the process and reduce the production cost.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
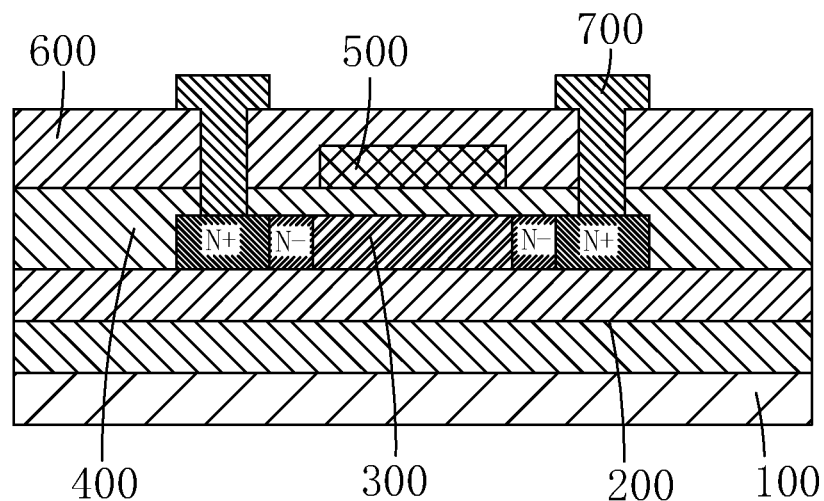
FIG. 1 is a cross-sectional view showing a known LTPS TFT substrate provided by an embodiment of the present invention.
Figure 2:
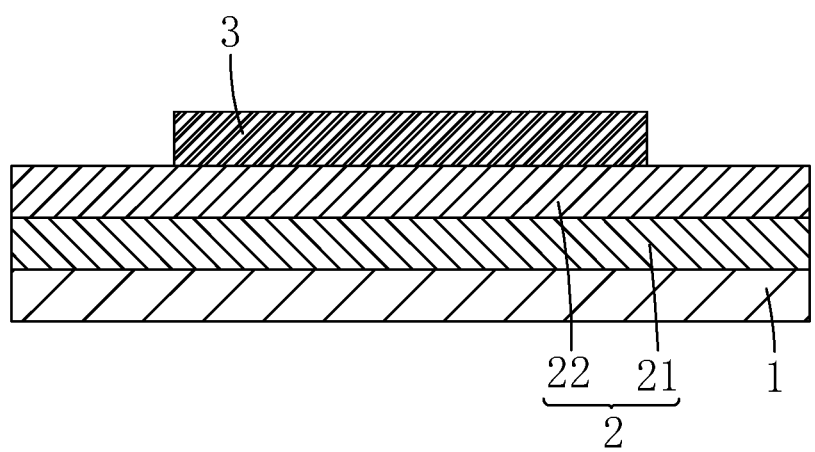
FIG. 2 is a schematic view showing Steps 1-2 of the manufacturing method for LTPS TFT substrate provided by an embodiment of the present invention.

Refer to FIGS. 2-6. The present invention provides a manufacturing method for LPTS TFT substrate, which comprises:

Step 1: as shown in FIG. 2, providing a substrate 1, and depositing a buffer layer 2 on the substrate 1.

Specifically, the substrate 1 is a glass substrate; the buffer layer 2 is a composite layer with a silicon nitride (SiNx) layer 21 and a silicon oxide (SiOx) layer 22.

Specifically, the thickness of the silicon nitride layer 21 is 40-100 nm; the thickness of the silicon oxide layer 22 is 100-200 nm.

Step 2: as shown in FIG. 2, depositing an a-Si layer on the buffer layer 2, performing dehydrogenation treatment on the a-Si layer, performing a crystallization process to turn the a-Si layer into a polysilicon layer, and patterning the polysilicon layer to obtain the island-shape polysilicon layer 3.

Specifically, the thickness of the a-Si layer is 40-60 nm.

Specifically, the crystallization process is an excimer laser annealing or solid-phase crystallization (SPC) process.

Figure 3:
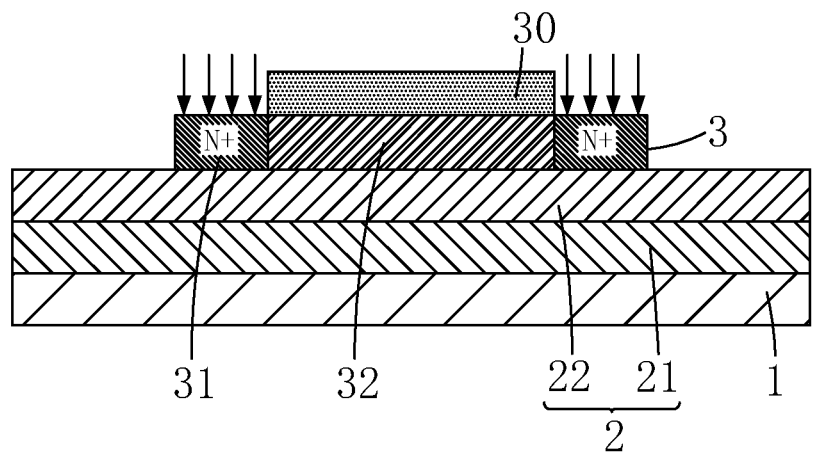
FIG. 3 is a schematic view showing Step 3 of the manufacturing method for LTPS TFT substrate provided by an embodiment of the present invention.

Step 3: as shown in FIG. 3, coating a photo-resist on the island-shape polysilicon layer 3 and performing exposure and development on the photo-resist to form a photo-resist layer 30; using the photo-resist layer 30 as a masking layer to perform ion implantation on both sides of the island-shape polysilicon layer 3 to form an N-type heavily doped (N+) area 31 on both sides of the island-shape polysilicon layer 3 and an undoped area 32 between the two N+ areas 31, and then peeling the photo-resist layer 30 off.

Specifically, the ion implanted to both sides of the island-shape polysilicon layer 3 is phosphorus (P) ion.

Figure 4:
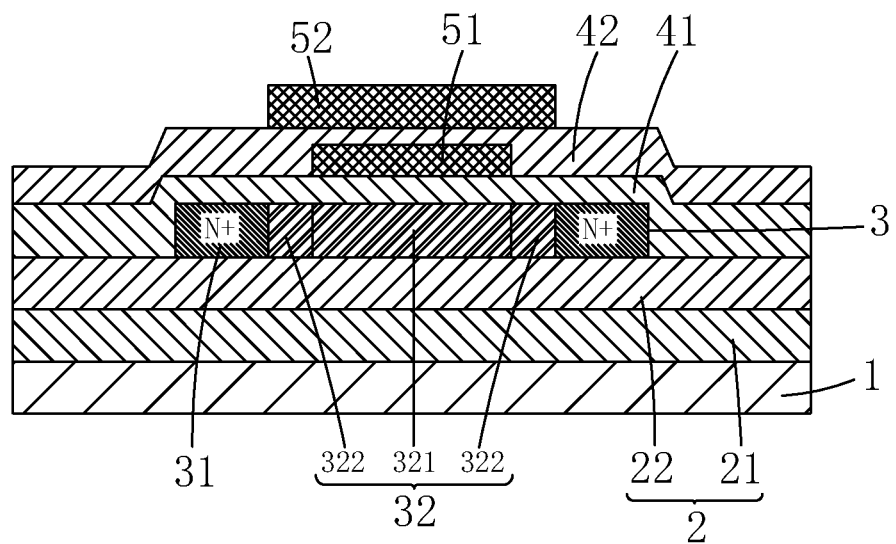
FIG. 4 is a schematic view showing Step 4 of the manufacturing method for LTPS TFT substrate provided by an embodiment of the present invention.

Step 4: as shown in FIG. 4, depositing a first gate insulating layer 41 on the island-shape polysilicon gate layer 3, depositing a first metal layer on the first gate insulating layer 41, and patterning the first metal layer to obtain a corresponding first gate 51 above the undoped area 32, and the first gate 51 having a width smaller than the width of the undoped area 32.

Step 5: as shown in FIG. 4, depositing a second gate insulating layer 42 on the first gate insulating layer 41 and the first gate 51, depositing a second metal layer on the second gate insulating layer 42, patterning the second metal layer to obtain a corresponding second gate 52 above the first gate 51, the second gate 52 having a width equal to the width of the undoped area 32, and both ends of the second gate 52 exceeding beyond both ends of the first gate 51 so that the portion of the undoped area 32 covered by both the first gate 51 and the second gate 52 forming a groove area 321 with strong electric field, and the portion of the undoped area 32 covered only by the second gate 52 forming a low electric field area 322.

Specifically, the groove area 321 and the low electric field area 322 between the two N+ areas on both sides can replace the LDD in the conventional TFT substrate to reduce the leakage current so as to decrease the number of ion implantation processes by one to simply the process and reduce production cost.

Specifically, the first gate insulating layer 41 and the second gate insulating layer 42 are made of silicon nitride or silicon oxide; the first gate 51 and the second gate 52 are made of molybdenum (Mo).

Specifically, the ends of the second gate 52 exceed beyond both ends of the first gate 51 by 1-2 µm, respectively.

Figure 5:
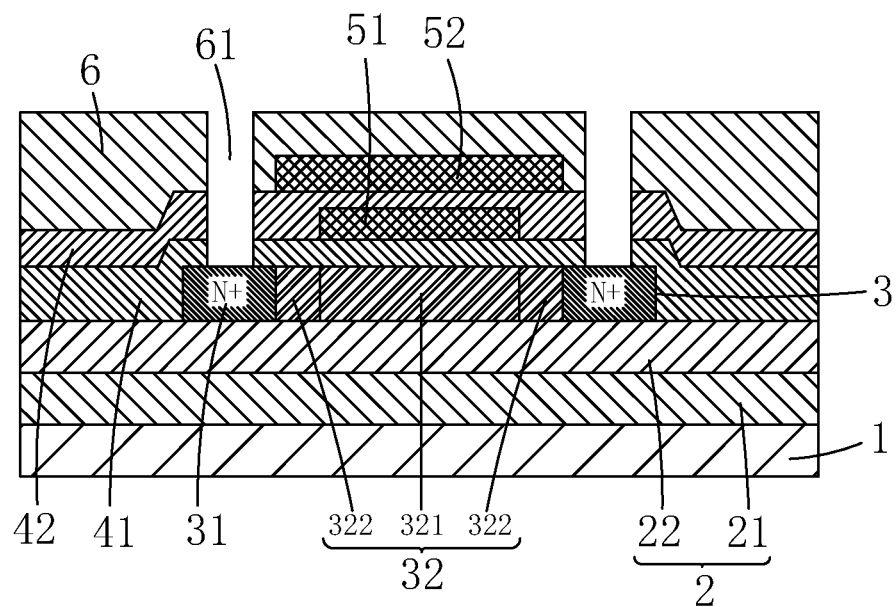
FIG. 5 is a schematic view showing Step 6 of the manufacturing method for LTPS TFT substrate provided by an embodiment of the present invention.

Step 6: as shown in FIG. 5, depositing an interlayer insulating layer 6 between the second gate insulting layer 42 and the second gate 52; performing a lithography process to form vias 61 on the interlayer insulating layer 6, the first gate insulating layer 41, and the second gate insulating layer 42 over the N+ areas 31 on both sides of the island-shape polysilicon layer 3.

Specifically, the interlayer insulating layer 6 is a silicon nitride layer, a silicon oxide layer, or a combination of the two.

Figure 6:
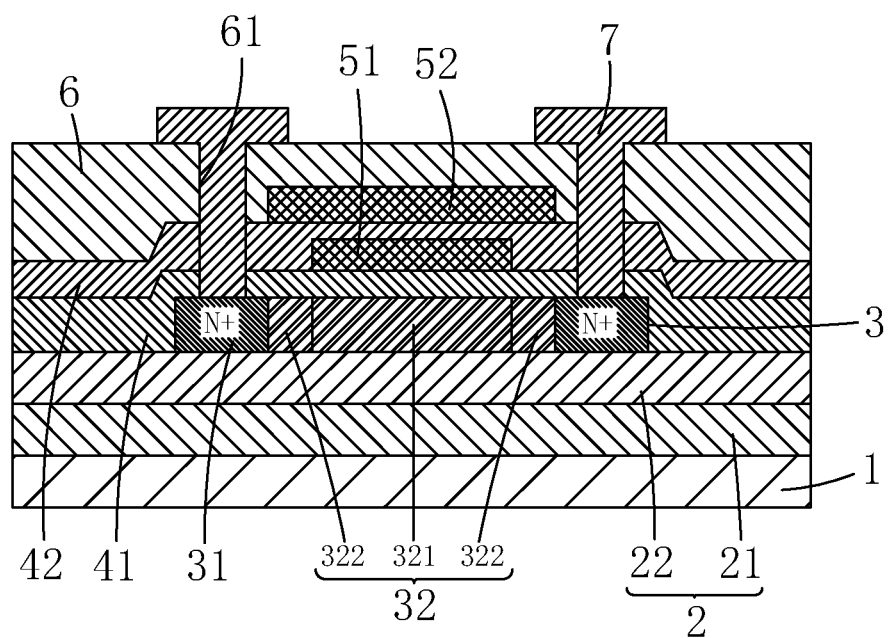
FIG. 6 is a schematic view showing Step 7 of the manufacturing method for LTPS TFT substrate provided by an embodiment of the present invention.

Step 7: as shown in FIG. 6, depositing a third metal layer on the interlayer insulating layer 6, patterning the third metal layer to obtain source/drain 7, the source/drain 7 contacting through the vias 61 the N+ areas 31 on both sides of the island-shape polysilicon layer 3.

Specifically, the source/drain is a molybdenum/aluminum/molybdenum composite layer; that is, a layer of aluminum sandwiched between two layers of molybdenum.

The above manufacturing method for LTPS TFT substrate, after forming N+ areas on both sides of the polysilicon layer, forms the first gate insulating layer, the first gate electrode, the second gate insulating layer, and the second gate sequentially on the polysilicon layer, and the second gate is wider than the first gate to produce a low electric field area in the polysilicon layer, thus to reduce the leakage current. The above method simplifies the process, and reduces production costs.

Figure 7:
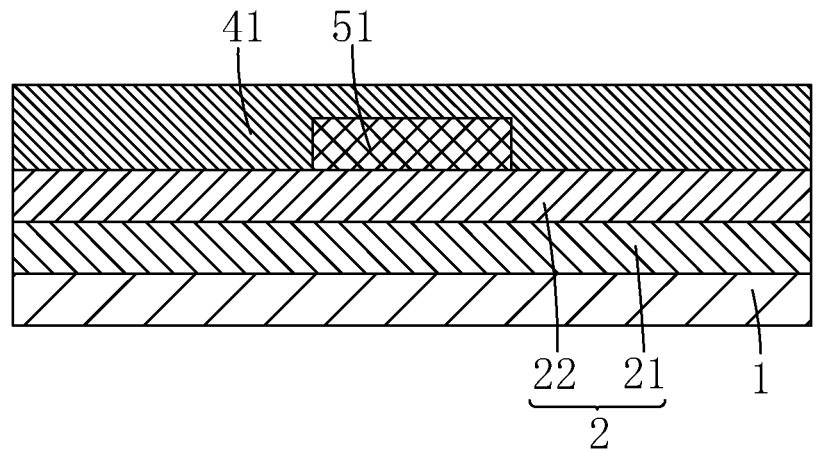
FIG. 7 is a schematic view showing Step 1 of the manufacturing method for LTPS TFT substrate provided by another embodiment of the present invention.

Refer to FIGS. 7-10. The present invention also provides a manufacturing method for LTPS TFT substrate, which comprises:

Step 1: as shown in FIG. 7, providing a substrate 1, and depositing a buffer layer 2 on the substrate 1.

Specifically, the substrate 1 is a glass substrate; the buffer layer 2 is a composite layer with a silicon nitride layer 21 and a silicon oxide layer 22.

Specifically, the thickness of the silicon nitride layer 21 is 40-100 nm; the thickness of the silicon oxide layer 22 is 100-200 nm.

Step 2: as shown in FIG. 7, depositing a first metal layer on the buffer layer 2, patterning the first metal layer to obtain a first gate 51, and depositing a first gate insulating layer 41 on the first gate 51.

Figure 8:
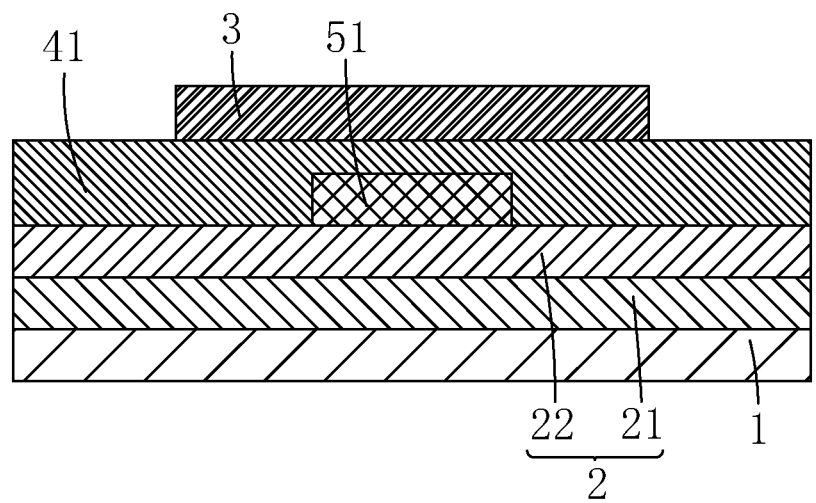
FIG. 8 is a schematic view showing Step 3 of the manufacturing method for LTPS TFT substrate provided by another embodiment of the present invention.

Step 3: as shown in FIG. 8, depositing an a-Si layer on the first gate insulating layer 41, performing dehydrogenation treatment on the a-Si layer, performing a crystallization process to turn the a-Si layer into a polysilicon layer, and patterning the polysilicon layer to obtain the island-shape polysilicon layer 3 above the corresponding first gate 51.

Specifically, the thickness of the a-Si layer is 40-60 nm.

Specifically, the crystallization process is an excimer laser annealing or solid-phase crystallization process.

Figure 9:
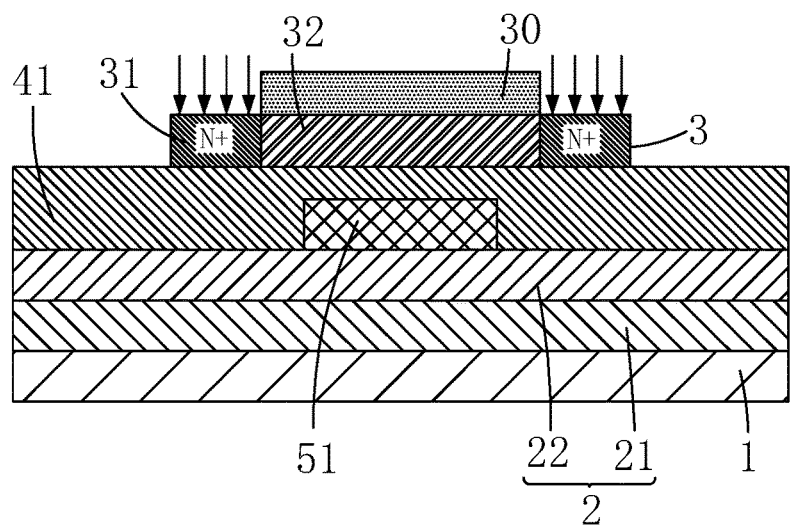
FIG. 9 is a schematic view showing Step 4 of the manufacturing method for LTPS TFT substrate provided by another embodiment of the present invention.

Step 4: as shown in FIG. 9, coating a photo-resist on the island-shape polysilicon layer 3 and performing exposure and development on the photo-resist to form a photo-resist layer 30; using the photo-resist layer 30 as a masking layer to perform ion implantation on both sides of the island-shape polysilicon layer 3 to form an N-type heavily doped (N+) area 31 on both sides of the island-shape polysilicon layer 30 and an undoped area 32 between the two N+ areas, and then peeling the photo-resist layer 30 off, wherein the undoped area 32 having a width greater than the width of the first gate 51.

Specifically, the ion implanted to both sides of the island-shape polysilicon layer 3 is phosphorus ion.

Figure 10:
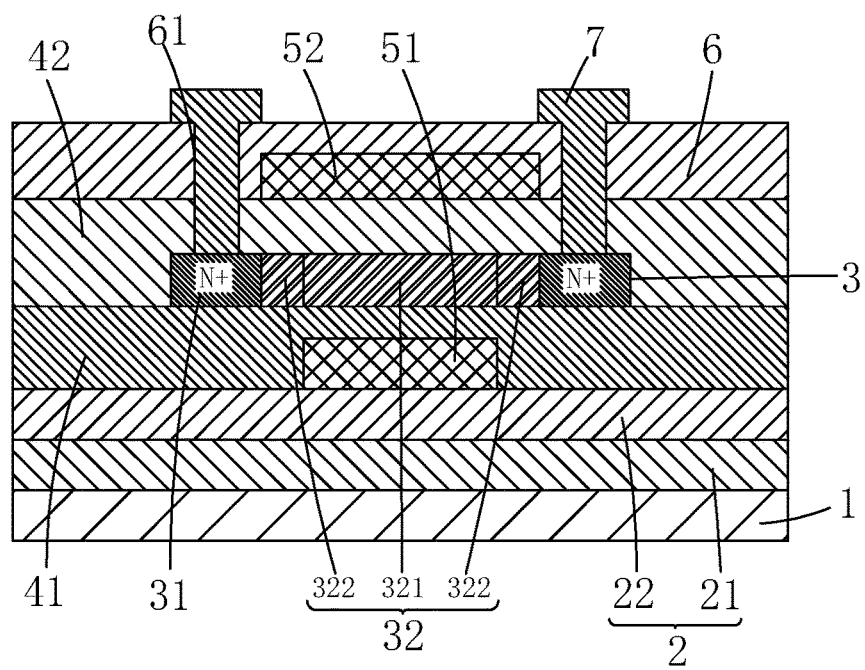
FIG. 10 is a schematic view showing Step 5 of the manufacturing method for LTPS TFT substrate provided by another embodiment of the present invention.

Step 5: as shown in FIG. 10, depositing a second gate insulating layer 42 on the island-shape polysilicon gate layer 3, depositing a second metal layer on the second gate insulating layer 42, and patterning the second metal layer to obtain a corresponding second gate 52 above the undoped area 32, and the second gate insulating layer 42 having a thickness greater than the thickness of the first gate insulating layer 41, wherein the second gate 52 having a width equal to the width of the undoped area 32, and both ends of the second gate 52 exceeding beyond both ends of the first gate 51 so that the portion of the undoped area 32 covered by both the first gate 51 and the second gate 52 forming a groove area 321 with strong electric field, and the portion of the undoped area 32 covered only by the second gate forming a low electric field area 322.

Specifically, because the low electric field area 322 is only covered by the second gate 52, and the second gate insulating layer 42 is thicker between the low electric field area 322 and the second gate 52, which can ensure the electric field generated in the low electric field area 322 is smaller, the less electrons are induced. Compared with the conventional TFT substrate, the low electric field area 322 can replace the LDD in conventional TFT substrate to reduce the leakage current, which decreases the number of ion implantation processes by one, simplifies the process, and reduces production cost.

Specifically, the first gate insulating layer 41 and the second gate insulating layer 42 are made of silicon nitride or silicon oxide; the first gate 51 and the second gate 52 are made of molybdenum.

Specifically, the ends of the second gate 52 exceed beyond both ends of the first gate 51 by 1-2 μm, respectively.

Specifically, the thickness of the second gate insulating layer is greater than the thickness of the first gate insulating layer by 200-500 Å; the ends of the second gate exceed beyond both ends of the first gate by 1-2 μm, respectively.

Step 6: as shown in FIG. 10, depositing an interlayer insulating layer 6 between the second gate insulting layer 42 and the second gate 52; performing a lithography process to form vias 61 on the interlayer insulating layer 6 and the second gate insulating layer 42 over the N+ areas 31 on both sides of the island-shape polysilicon layer 3.

Specifically, the interlayer insulating layer 6 is a silicon nitride layer, a silicon oxide layer, or a combination of the two.

Step 7: as shown in FIG. 10, depositing a third metal layer on the interlayer insulating layer 6, patterning the third metal layer to obtain source/drain 7, the source/drain 7 contacting through the vias 61 the N+ areas 31 on both sides of the island-shape polysilicon layer 3.

Specifically, the source/drain is a molybdenum/aluminum/molybdenum composite layer; that is, a layer of aluminum sandwiched between two layers of molybdenum.

The above manufacturing method for LTPS TFT substrate first forms the first gate and the first gate insulating layer on the buffer layer, and forms a polysilicon layer and N+ areas on both sides of the polysilicon layer on the first gate insulating layer; and then forms the second gate insulating layer and the second gate, with the second gate thicker than the first gate insulating layer and wider than the first gate so that the thickness of the second gate insulating layer sandwiched between the portion of the second gate exceeding beyond the first gate and the polysilicon layer is thicker to produce a low electric field area in the polysilicon layer and induce less electrons, thus to reduce the leakage current. The above method simplifies the process, and reduces production costs.

In summary, the present invention provides a manufacturing method for LTPS TFT substrate. After forming N+ areas on both sides of the polysilicon layer, the first gate insulating layer, the first gate, the second gate insulating layer, and the second gate are sequentially formed on the polysilicon layer, and the second gate having a width greater than the width of the first gate to produce a low electric field region in the polysilicon layer to reduce the leakage current; alternatively, forming the first gate and the first gate insulating layer on the buffer layer, and after forming the polysilicon layer and N+ areas on both sides of the polysilicon layer, the second gate insulating layer and the second gate are formed on the polysilicon layer, and the second gate insulating layer is thicker than the first gate insulating layer and the second gate is wider than the first gate, so that the second gate insulating layer sandwiched by the portion of the second gate beyond the first gate and polysilicon layer is thicker and produces a smaller electric field, less electrons are induced in the polysilicon layer, and thus to reduce the leakage current. Compared with the prior art, the present invention, after forming N+ areas on both sides of the polysilicon layer, does not need to use a mask to define N− areas and implant low dosage of phosphorus ions to form N− areas to reduce leakage current, but to use the difference between the first gate and the second gate to produce a low electric field to reduce the leakage current, which simplifies the process and reduce the production cost.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method for low temperature polysilicon (LTPS) thin film transistor (TFT) substrate, which comprises:

Step 1: providing a substrate, and depositing a buffer layer on the substrate;

Step 2: depositing an amorphous silicon (a-Si) layer on the buffer layer, performing dehydrogenation treatment on the a-Si layer, performing a crystallization process to turn the a-Si layer into a polysilicon layer, and patterning the polysilicon layer to obtain an island-shape polysilicon layer;

Step 3: coating a photo-resist on the island-shape polysilicon layer and performing exposure and development on the photo-resist to form a photo-resist layer; using the photo-resist layer as a masking layer to perform ion implantation on both sides of the island-shape polysilicon layer to form an N-type heavily doped (N+) area on the both sides of the island-shape polysilicon layer and an undoped area between the two N+ areas, and then peeling the photo-resist layer off;

Step 4: depositing a first gate insulating layer on the island-shape polysilicon gate layer, depositing a first metal layer on the first gate insulating layer, and patterning the first metal layer to obtain a corresponding first gate above the undoped area, and the first gate having a width smaller than a width of the undoped area;

Step 5: depositing a second gate insulating layer on the first gate insulating layer and the first gate, depositing a second metal layer on the second gate insulating layer, patterning the second metal layer to obtain a corresponding second gate above the first gate, the second gate having a width equal to the width of the undoped area, and the both ends of the second gate extending beyond the both ends of the first gate so that a portion of the undoped area covered by the first gate and the second gate forms a groove area with a strong electric field, and the portion of the undoped area covered only by the second gate forming a low electric field area;

Step 6: depositing an interlayer insulating layer between the second gate insulting layer and the second gate; performing a lithography process to form vias on the interlayer insulating layer, the first gate insulating layer, and the second gate insulating layer over the N+ areas on the both sides of the island-shape polysilicon layer; and Step 7: depositing a third metal layer on the interlayer insulating layer, patterning the third metal layer to obtain a source and a drain, the source and the drain contacting through the vias the N+ areas on the both sides of the island-shape polysilicon layer.

2. The manufacturing method for LTPS TFT substrate as claimed in claim 1, wherein in Step 1, the substrate is a glass substrate; the buffer layer is a laminant layer with a silicon nitride layer and a silicon oxide layer; the thickness of the silicon nitride layer is 40-100 nm; the thickness of the silicon oxide layer is 100-200 nm.

3. The manufacturing method for LTPS TFT substrate as claimed in claim 1, wherein in Step 3, the thickness of the a-Si layer is 40-60 nm; the crystallization process is an excimer laser annealing or solid-phase crystallization process.

4. The manufacturing method for LTPS TFT substrate as claimed in claim 1, wherein the first gate insulating layer and the second gate insulating layer are made of silicon nitride or silicon oxide; the first gate and the second gate are made of molybdenum; the interlayer insulating layer is a silicon nitride layer, a silicon oxide layer, or a combination of the two; the source and the drain are a molybdenum/aluminum/molybdenum laminant layer.

5. The manufacturing method for LTPS TFT substrate as claimed in claim 1, wherein the ends of the second gate extend beyond the both ends of the first gate by 1-2 μm, respectively.

6. A manufacturing method for low temperature polysilicon (LTPS) thin film transistor (TFT) substrate, which comprises:

Step 1: providing a substrate, and depositing a buffer layer on the substrate;

Step 2: depositing a first metal layer on the buffer layer, patterning the first metal layer to obtain a first gate, and depositing a first gate insulating layer on the first gate;

Step 3: depositing an amorphous silicon (a-Si) layer on the first gate insulating layer, performing dehydrogenation treatment on the a-Si layer, performing a crystallization process to turn the a-Si layer into a polysilicon layer, and patterning the polysilicon layer to obtain an island-shape polysilicon layer above the corresponding first gate;

Step 4: coating a photo-resist on the island-shape polysilicon layer and performing exposure and development on the photo-resist to form a photo-resist layer; using the photo-resist layer as a masking layer to perform ion implantation on both sides of the island-shape polysilicon layer to form N-type heavily doped (N+) areas on both sides of the island-shape polysilicon layer and an undoped area between the N type heavily doped N+ areas, and then peeling the photo-resist layer off, wherein the undoped area having a width greater than the a width of the first gate;

Step 5: depositing a second gate insulating layer on the island-shape polysilicon gate layer, depositing a second metal layer on the second gate insulating layer, and patterning the second metal layer to obtain a corresponding second gate above the undoped area, and the second gate insulating layer having a thickness greater than a thickness of the first gate insulating layer, wherein the second gate having a width equal to a width of the undoped area, and both ends of the second gate extending beyond the both ends of the first gate so that a portion of the undoped area covered by both the first gate and the second gate forms a groove area with a strong electric field, and the portion of the undoped area covered only by the second gate forming a low electric field area;

Step 6: depositing an interlayer insulating layer between the second gate insulting layer and the second gate; performing a lithography process to form vias on the interlayer insulating layer and the second gate insulating layer over the N+ areas on both sides of the island-shape polysilicon layer; and Step 7: depositing a third metal layer on the interlayer insulating layer, patterning the third metal layer to obtain source/drain, the source/drain contacting through the vias the N-type heavily doped N+ areas on the both sides of the island-shape polysilicon layer.

7. The manufacturing method for LTPS TFT substrate as claimed in claim 6, wherein in Step 1, the substrate is a glass substrate; the buffer layer is a laminant layer with a silicon nitride layer and a silicon oxide layer; a thickness of the silicon nitride layer is 40-100 nm; a thickness of the silicon oxide layer is 100-200 nm.

8. The manufacturing method for LTPS TFT substrate as claimed in claim 6, wherein in Step 2, a thickness of the a-Si layer is 40-60 nm; the crystallization process is an excimer laser annealing or solid-phase crystallization process.

9. The manufacturing method for LTPS TFT substrate as claimed in claim 6, wherein the first gate insulating layer and the second gate insulating layer are made of silicon nitride or silicon oxide; the first gate and the second gate are made of molybdenum; the interlayer insulating layer is a silicon nitride layer, a silicon oxide layer, or a combination of the two; the source/drain is a molybdenum/aluminum/molybdenum laminant layer.

10. The manufacturing method for LTPS TFT substrate as claimed in claim 6, wherein a thickness of the second gate insulating layer is greater than a thickness of the first gate insulating layer by 200-500 Å; respective ends of the second gate extend beyond the both ends of the first gate by 1-2 μm, respectively.

11. A manufacturing method for low temperature polysilicon (LTPS) thin film transistor (TFT) substrate, which comprises:

Step 1: providing a substrate, and depositing a buffer layer on the substrate;

Step 2: depositing a first metal layer on the buffer layer, patterning the first metal layer to obtain a first gate, and depositing a first gate insulating layer on the first gate;

Step 3: depositing an amorphous silicon (a-Si) layer on the first gate insulating layer, performing dehydrogenation treatment on the a-Si layer, performing a crystallization process to turn the a-Si layer into a polysilicon layer, and patterning the polysilicon layer to obtain an island-shape polysilicon layer above the corresponding first gate;

Step 4: coating a photo-resist on the island-shape polysilicon layer and performing exposure and development on the photo-resist to form a photo-resist layer; using the photo-resist layer as a masking layer to perform ion implantation on both sides of the island-shape polysilicon layer to form N-type heavily doped (N+) areas on both sides of the island-shape polysilicon layer and an undoped area between the two N+ areas, and then peeling the photo-resist layer off, wherein the undoped area has a width greater than a width of the first gate;

Step 5: depositing a second gate insulating layer on the island-shape polysilicon gate layer, depositing a second metal layer on the second gate insulating layer, and patterning the second metal layer to obtain a corresponding second gate above the undoped area, and the second gate insulating layer having a thickness greater than a thickness of the first gate insulating layer, wherein the second gate having a width equal to the width of the undoped area, and both ends of the second gate extending beyond both ends of the first gate so that a portion of the undoped area covered by both the first gate and the second gate forms a groove area with a strong electric field, and the portion of the undoped area covered only by the second gate forms a low electric field area;

Step 6: depositing an interlayer insulating layer between the second gate insulting layer and the second gate; performing a lithography process to form vias on the interlayer insulating layer and the second gate insulating layer over the N-type heavily doped N+ areas on both sides of the island-shape polysilicon layer; and Step 7: depositing a third metal layer on the interlayer insulating layer, patterning the third metal layer to obtain a source and a drain, the source and the drain contacting through the vias the N-type heavily doped N+ areas on both sides of the island-shape polysilicon layer;

wherein in Step 1, the substrate is a glass substrate; the buffer layer is a composite layer with a silicon nitride layer and a silicon oxide layer; the thickness of the silicon nitride layer is 40-100 nm; the thickness of the silicon oxide layer is 100-200 nm;

wherein in Step 2, the thickness of the a-Si layer is 40-60 nm; the crystallization process is an excimer laser annealing or solid-phase crystallization process;

wherein the first gate insulating layer and the second gate insulating layer are made of silicon nitride or silicon oxide; the first gate and the second gate are made of molybdenum; the interlayer insulating layer is a silicon nitride layer, a silicon oxide layer, or a combination of the two; the source and the drain are a molybdenum/aluminum/molybdenum laminant layer;

wherein a thickness of the second gate insulating layer is greater than a thickness of the first gate insulating layer by 200-500 Å; ends of the second gate extend beyond both ends of the first gate by 1-2 μm, respectively.

* * * * *